(12) United States Patent
Lee et al.

(10) Patent No.: US 12,219,705 B2
(45) Date of Patent: Feb. 4, 2025

(54) FLEXIBLE PRINTED CIRCUIT BOARD, COF MODULE, AND ELECTRONIC DEVICE COMPRISING THE SAME

(71) Applicant: LG INNOTEK CO., LTD., Seoul (KR)

(72) Inventors: Eon Jong Lee, Seoul (KR); Hyun Jin Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 272 days.

(21) Appl. No.: 18/050,737

(22) Filed: Oct. 28, 2022

(65) Prior Publication Data

US 2023/0135478 A1 May 4, 2023

(30) Foreign Application Priority Data

Oct. 29, 2021 (KR) ................. 10-2021-0147328

(51) Int. Cl.
*H05K 1/11* (2006.01)
*H05K 1/02* (2006.01)

(52) U.S. Cl.
CPC ............. *H05K 1/117* (2013.01); *H05K 1/028* (2013.01); *H05K 2201/10128* (2013.01)

(58) Field of Classification Search
CPC ................... H05K 1/117; H05K 1/028; H05K 2201/10128
USPC ........................................................ 361/749
See application file for complete search history.

(56) References Cited

U.S. PATENT DOCUMENTS

| 9,398,686 B2 | 7/2016 | Shin et al. |
| 2010/0072607 A1 | 3/2010 | Chung et al. |
| 2015/0077948 A1* | 3/2015 | Kanno ................. H05K 1/0269 361/749 |
| 2020/0343312 A1* | 10/2020 | Ryu ....................... H10K 59/40 |

FOREIGN PATENT DOCUMENTS

| KR | 10-0618898 B1 | 9/2009 |
| KR | 10-2015-0097849 A | 8/2015 |

* cited by examiner

*Primary Examiner* — Andargie M Aychillhum
(74) *Attorney, Agent, or Firm* — Saliwanchik, Lloyd & Eisenschenk

(57) ABSTRACT

A flexible printed circuit board according to an embodiment includes a substrate, a circuit pattern disposed on the substrate and a protective layer disposed on the circuit pattern, and the circuit pattern includes a first circuit pattern and a second circuit pattern, and the first circuit pattern includes a first pad part, a second pad part, and a first wiring part connected to the first pad part and the second pad part, and the first wiring part includes a first pattern extending in contact with the second pad part, and the first pattern includes a first pattern part and a second pattern part disposed under the protective layer, and the first pattern part includes an extension area having a width greater than that of the second pattern part, and a maximum width of the first pattern part is greater than a maximum width of the second pad part.

18 Claims, 12 Drawing Sheets

FLEXIBLE PRINTED CIRCUIT BOARD, COF MODULE, AND ELECTRONIC DEVICE COMPRISING THE SAME

CROSS-REFERENCE TO RELATED APPLICATION

This application claims priority under 35 U.S.C. 119 and 35 U.S.C. 365 to Korean Patent Application No. 10-2021-0147328, filed Oct. 29, 2021, which is hereby incorporated by reference in its entirety.

TECHNICAL FIELD

An embodiment relates to a flexible printed circuit board, a COF module, and an electronic device including the same. In detail, the flexible printed circuit board may be a flexible printed circuit board for COF.

BACKGROUND ART

Recently, various electronic products are thin, miniaturized, and lightened. Accordingly, a research for mounting a semiconductor chip at a high density in a narrow region of an electronic device is being conducted in various ways.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases.

A chip on film (COF) is a method in which a semiconductor chip is mounted on a flexible printed circuit board in the form of a thin film. For example, the semiconductor chip may be an integrated circuit (IC) chip or a large scale integrated circuit (LSI) chip.

Meanwhile, the chip may be connected to an external PCB and a display panel through a circuit pattern. For example, a pad part is disposed at one end and the other end of the circuit pattern, respectively. One pad part may be electrically connected to the terminal of the chip, and the other pad part may be connected to the terminals of the PCB and the display panel.

Accordingly, the chip, the PCB, and the display panel may be electrically connected through the COF, and a signal may be transmitted to the display panel through the circuit pattern.

As described above, the COF (Chip On Film) type flexible printed circuit board is applied to a flexible display. Accordingly, the flexible printed circuit board may be bent in one direction.

Accordingly, when the flexible printed circuit board is bent, cracks or film removal may occur in the circuit pattern positioned in the bent area. Thereby, electrical characteristics of the flexible printed circuit board may be reduced.

In this case, the partition wall part must have a certain dielectric characteristic for electrical connection between the pattern part and the electrode. However, there is a problem in that the leakage current increases in the direction of the partition wall part between the pattern parts due to the dielectric characteristics, and accordingly, the driving voltage is increased and the driving characteristics are reduced.

Therefore, the flexible printed circuit board including the same having a new structure that can solve the above problems are required.

DISCLOSURE

Technical Problem

An embodiment is to provide a flexible printed circuit board capable of improving the reliability of a circuit pattern of the flexible printed circuit board when bending the flexible printed circuit board.

Technical Solution

A flexible printed circuit board according to an embodiment includes a substrate, a circuit pattern disposed on the substrate and a protective layer disposed on the circuit pattern, and the circuit pattern includes a first circuit pattern and a second circuit pattern, and the first circuit pattern includes a first pad part, a second pad part, and a first wiring part connected to the first pad part and the second pad part, and the first wiring part includes a first pattern extending in contact with the second pad part, and the first pattern includes a first pattern part and a second pattern part disposed under the protective layer, and the first pattern part includes an extension area having a width greater than that of the second pattern part, and a maximum width of the first pattern part is greater than a maximum width of the second pad part.

Advantageous Effects

The flexible printed circuit board according to the embodiment includes a first wiring part and a second wiring part. A width or thickness of the first wiring prat disposed in the first area may be greater than a width or thickness of the first wiring prat disposed in the second area. Accordingly, the strength of the first wiring part disposed in the first area may be increased. Accordingly, when the flexible printed circuit board is bent and folded in the first area, it is possible to inhibit cracks in the first wiring part disposed in the first area.

Also, the width of the first wiring part disposed in the first area may be varied. That is, the width of the first wiring part disposed in the first area may gradually decrease as it moves away from the bending axis. Alternatively, the width of the first wiring part disposed in the first area may gradually increase as it moves away from the bending axis.

Accordingly, the width of the first wiring part may be set according to a change in stress according to the shape of the first area bent by the bending axis.

MODES OF THE INVENTION

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a flexible printed circuit board, a COF module, and an electronic device including the same according to an embodiment will be described with reference to the drawings.

Figure 1:
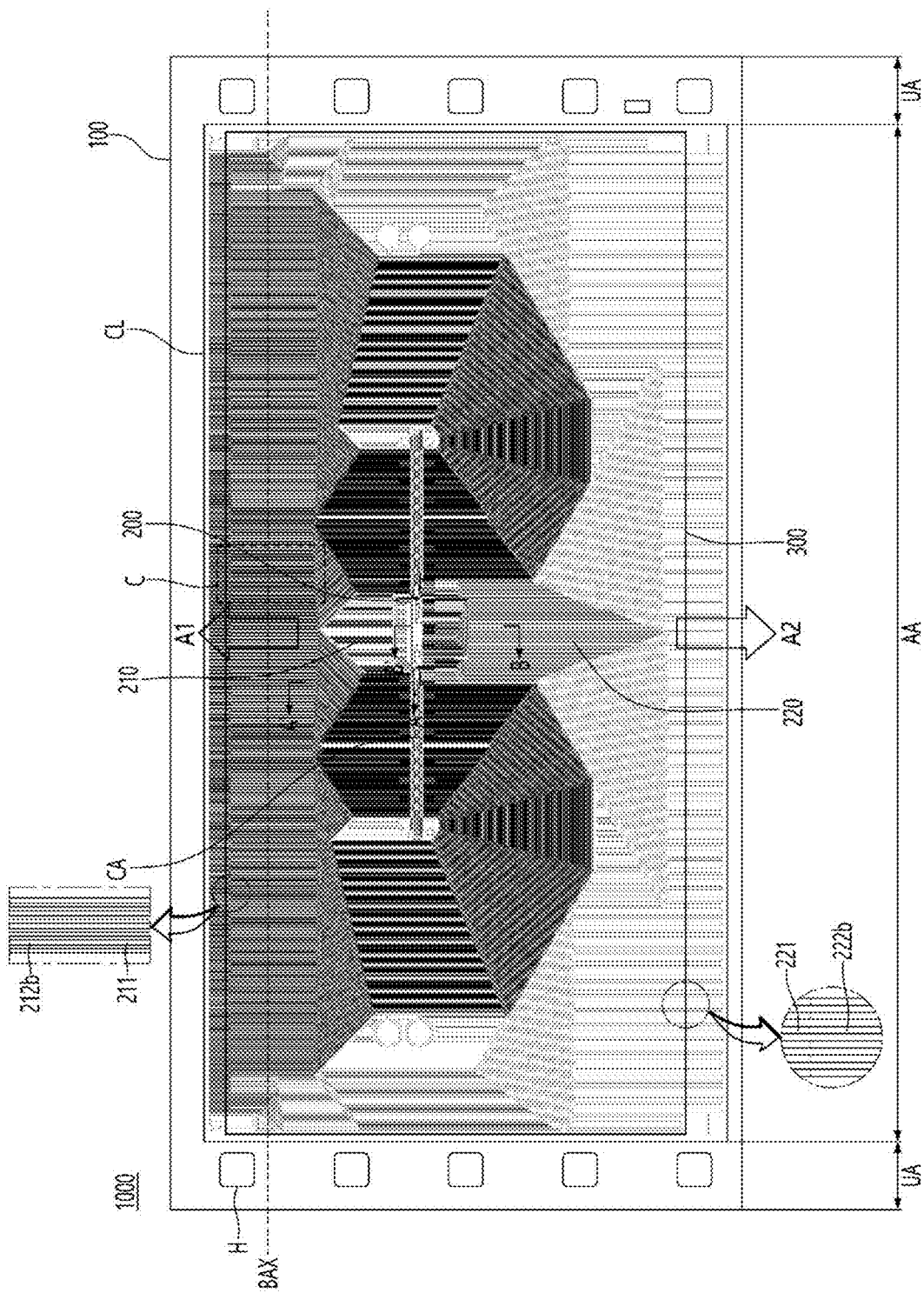
FIG. 1 is a top view of a flexible printed circuit board according to an embodiment.
Figure 2:
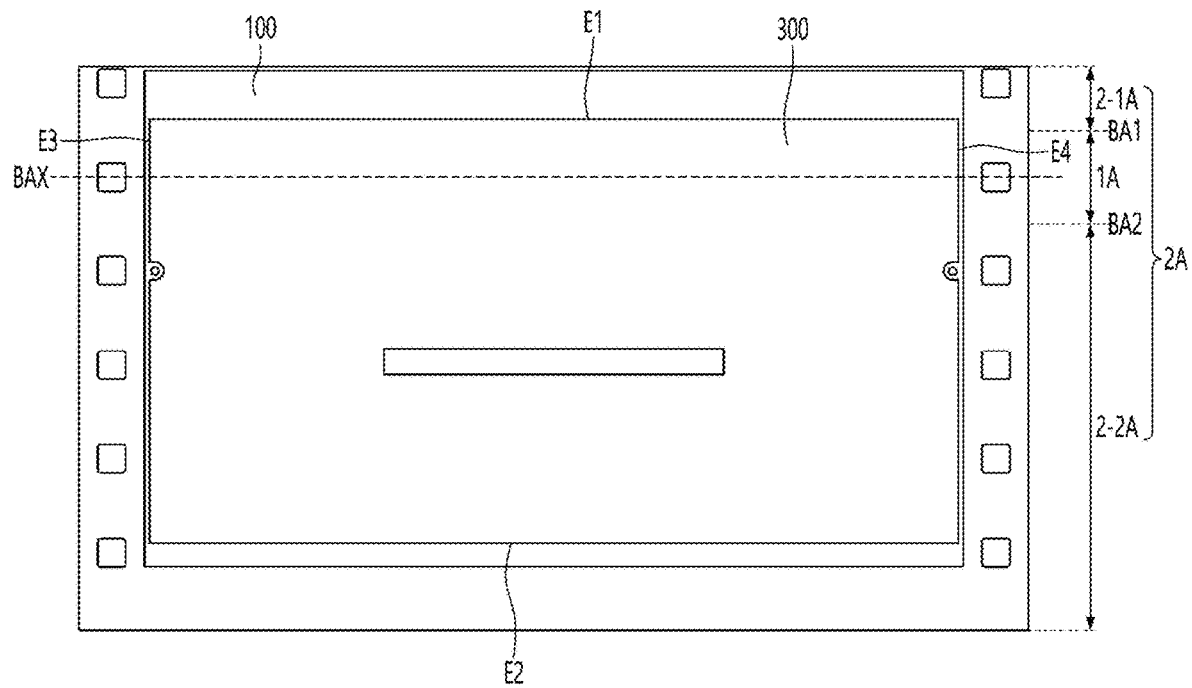
FIG. 2 is a top view of in which a circuit pattern is omitted in the flexible printed circuit board according to the first embodiment.

FIGS. 1 and 2 are top views of a flexible printed circuit board according to an embodiment.

Referring to FIGS. 1 and 2, a flexible printed circuit board 1000 according to the embodiment may include a substrate 100 and a circuit pattern 200 disposed on the substrate 100.

The substrate 100 may include a flexible substrate. For example, the substrate 100 may be a polyimide (PI) substrate. However, the embodiment is not limited thereto, and the substrate 100 may include a polymer material such as polyethylene terephthalate (PET), polyethylene naphthalate (PEN), or the like. Accordingly, the flexible printed circuit board including the substrate 100 may be used in various electronic devices having a curved display device. For example, the flexible printed circuit board including the substrate 100 is excellent in flexible characteristics, thereby having suitability of mounting a semiconductor chip on a wearable electronic device.

The substrate 100 may have a thickness of 20 μm to 100 μm. For example, the substrate 100 may have a thickness of 25 μm to 50 μm. For example, the substrate 100 may have a thickness of 30 μm to 40 μm. When the thickness of the substrate 100 exceeds 100 μm, the overall thickness of the flexible printed circuit board may be increased, and accordingly, the flexible characteristics may be deteriorated. In addition, when the thickness of the substrate 100 is less than 20 μm, when the chip is mounted on the flexible printed circuit board, the flexible printed circuit board may be damaged by heat/pressure applied to the substrate 100.

The substrate 100 may include an effective area AA and an ineffective area UA. For example, the effective area AA may be a central area of the substrate 100, and the ineffective area UA may be an edge area of the substrate 100.

The effective area AA may include a chip mounting region CA. In detail, the effective area AA may include the chip mounting region CA in which a chip C connected to the circuit pattern is mounted.

In addition, circuit patterns 210 and 220 may be disposed on the effective area AA. In detail, a plurality of circuit patterns that are spaced apart from each other and extend in multiple directions may be disposed in the effective area AA.

The effective area AA may be an area actually used in the flexible printed circuit board 1000. That is, the effective area AA may be an area connected to the display panel or the printed circuit board.

The circuit pattern may not be disposed in the ineffective area UA. That is, the effective area AA and the ineffective area UA may be divided according to the presence or absence of the arrangement of the circuit pattern.

The ineffective area UA may include a plurality of holes. In detail, the ineffective area UA may include a plurality of sprocket holes H. The flexible printed circuit board may be wound or unwound by the sprocket hole H in a roll-to-roll manner.

The ineffective area UA may be an area that is not actually used in the flexible printed circuit board 1000. That is, the ineffective area UA may be an area to be removed.

A boundary between the effective area AA and the ineffective area may be defined as a cutting line CL.

In detail, a COF module may be formed by mounting a chip on the flexible printed circuit board 1000 and cutting the cutting line CL. In addition, the COF module may be disposed in various electronic devices.

Referring to FIGS. 1 and 2, a bending axis BAX may be defined in the flexible printed circuit board 1000. In detail, the flexible printed circuit board 1000 may be bent in one direction. Accordingly, the flexible printed circuit board 1000 may define a bending axis BAX formed along a bending direction.

Also, in the flexible printed circuit board 1000, a first area 1A and a second area 2A may be defined by the bending axis BAX. That is, the flexible printed circuit board 1000 may include a region having a curvature and a region having (almost) no curvature. For example, the flexible printed circuit board 1000 may include the first area 1A having a curvature R greater than zero and a second area 2A having a curvature equal to or close to zero. The first area 1A may be an area that is bent when the flexible printed circuit board 1000 is bent, and the second area 2A may be an area that is not bent when the flexible printed circuit board 1000 is bent. The second area may be a flat or nearly flat area.

Here, the curvature R may be defined as a reciprocal of a curvature radius.

The circuit pattern may include a wiring part and a pad part. In addition, the plurality of circuit patterns may be disposed in the effective area AA. In detail, a first circuit pattern 210 and a second circuit pattern 220 may be disposed in the effective area AA.

Figure 3:
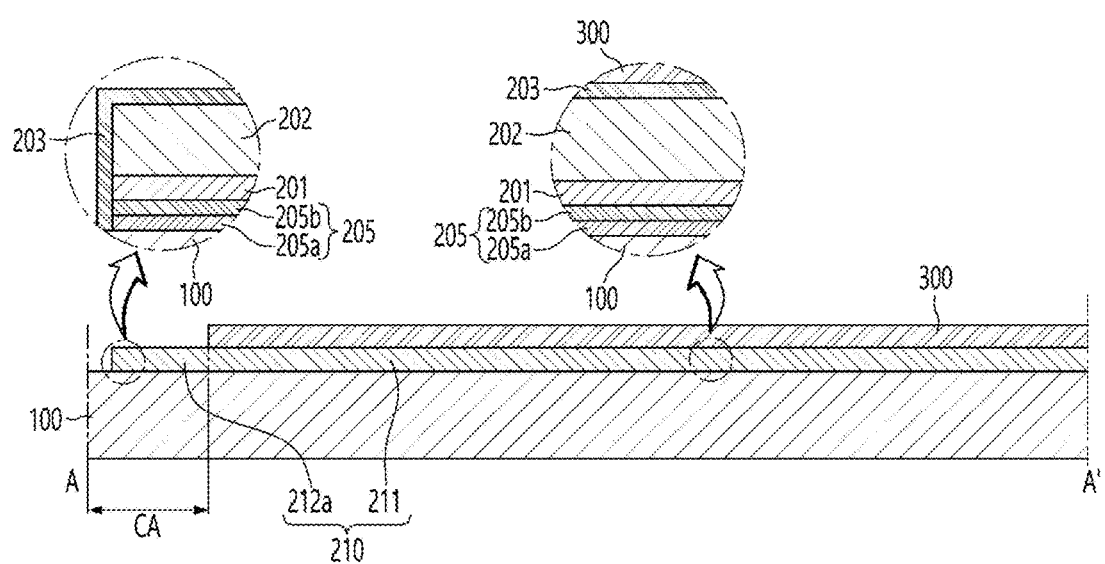
FIGS. 3 and 4 are cross-sectional views taken along line A-A' in FIG. 1.

Referring to FIGS. 1, 3 and 2, the first circuit pattern 210 may include a first wiring part 211, a first pad part 212a, and a second pad part 212b. In detail, the first circuit pattern 210 may include the first pad part 212a disposed inside the chip mounting region CA. Also, the first circuit pattern 210 may include the second pad part 212b disposed outside the chip mounting region CA. Also, the first wiring part 211 may be connected to the first pad part 212a and the second pad part 212b between the first pad part 212a and the second pad part 212b.

The first wiring part 211, the first pad part 212a and the second pad part 212b may be integrally formed.

Also, the first wiring part 211 may be disposed to extend in the A1 direction with respect to the chip mounting region CA.

The first pad part 212a may be electrically connected to a chip disposed in the chip mounting region. In addition, the second pad part 212b may be electrically connected to a display panel. In addition, the first wiring part 211 may transmit a signal between the chip and the display panel.

A protective layer 300 may be disposed on the first circuit pattern 210. In detail, the protective layer 300 may be disposed on the first wiring part 211. The protective layer 300 may be disposed to surround the first wiring part 211. In addition, the protective layer 300 may not be disposed on the first pad part 212a and the second pad part 212b.

That is, the first wiring part 211 is disposed under the protective layer 300. In addition, the protective layer 300 is not disposed on the first pad part 212a and the second pad part 212b, and may be exposed to the outside of the protective layer.

Figure 5:
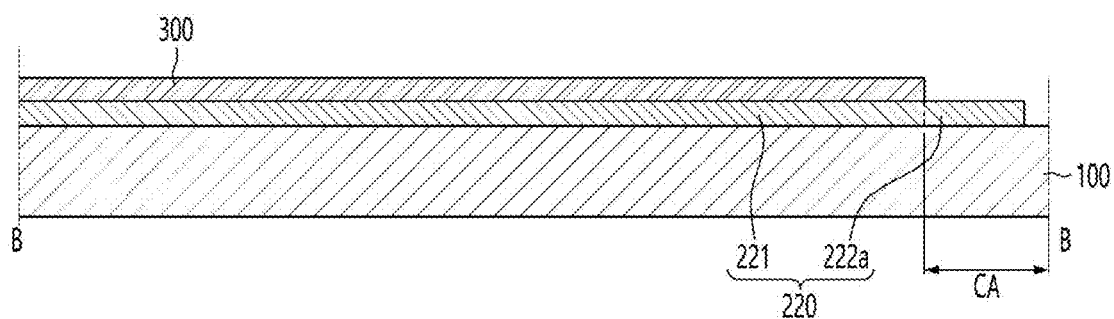
FIG. 5 is cross-sectional views taken along line B-B' in FIG. 1.

Referring to FIGS. 1 and 5, the second circuit pattern 220 may include a second wiring part 221, a third pad part 222a, and a fourth pad part 222b. In detail, the second circuit pattern 220 may include the third pad part 222a disposed inside the chip mounting region CA. Also, the second circuit pattern 220 may include the fourth pad part 222b disposed outside the chip mounting region CA. Also, the second wiring part 221 may be connected to the third pad part 222a and the fourth pad part 222b between the third pad part 222a and the fourth pad part 222b.

The second wiring part 221, the third pad part 222a and the fourth pad part 222b may be integrally formed.

Also, the second wiring part 221 may be disposed to extend in the A2 direction with respect to the chip mounting region CA. In detail, the second wiring part 221 may be disposed to extend in the A2 direction opposite to the A1 direction.

The third pad part 222a may be electrically connected to a chip disposed in the chip mounting region. In addition, the fourth pad part 222b may be electrically connected to a display panel. In addition, the second wiring part 221 may transmit a signal between the chip and the display panel.

The protective layer 300 may be disposed on the second circuit pattern 220. In detail, the protective layer 300 may be disposed on the second wiring part 221. The protective layer 300 may be disposed to surround the second wiring part 221. In addition, the protective layer 300 may not be disposed on the third pad part 222a and the fourth pad part 222b.

That is, the second wiring part 221 is disposed under the protective layer 300. In addition, the protective layer 300 is not disposed on the first pad part 212a and the second pad part 212b, and may be exposed to the outside of the protective layer.

The first circuit pattern 210 and the second circuit pattern 220 may include a metal material having excellent electrical conductivity. In detail, the first circuit pattern 210 and the second circuit pattern 220 may include copper (Cu). However, the embodiment is not limited thereto, and the first circuit pattern 210 and the second circuit pattern 220 may include at least one metal among copper (Cu), aluminum (Al), and chromium (Cr), nickel (Ni), silver (Ag), molybdenum (Mo), gold (Au), titanium (Ti), and an alloy thereof.

Figure 4:
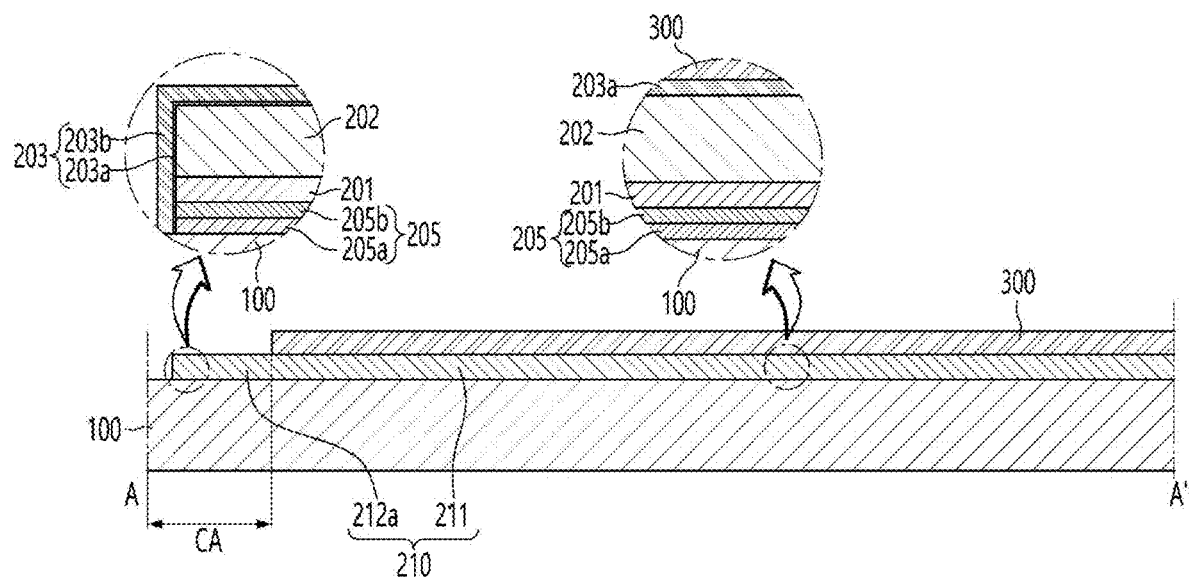

Hereinafter, the layer structure of the circuit pattern of the flexible printed circuit board according to the embodiment will be described with reference to FIGS. 3 and 4. FIGS. 3 and 4, the first circuit pattern 210 will be mainly described. However, the embodiment is not limited thereto. The description of the layer structure described in FIGS. 3 and 4 may be equally applied to the second circuit pattern 220.

Referring to FIG. 3, the first circuit pattern 210 may be formed in multiple layers. In detail, the first wiring part 211 and the first pad part 212a may include a first metal layer 201 and a second metal layer 202. In addition, although not shown in FIG. 3, the second pad part 212b may also include the first metal layer 201 and the second metal layer 202.

The first metal layer may be a seed layer of the first circuit pattern 210. In detail, the first metal layer 201 may be a seed layer formed by electroless plating a metal material such as copper (Cu) disposed on the substrate 100. In detail, the first metal layer 201 may be a seed layer formed by electroless plating a metal material such as copper (Cu) disposed on the substrate 100.

In addition, the second metal layer 202 may be a plating layer. In detail, the second metal layer 202 may be a plating layer formed by electroplating using the first metal layer 201 as a seed layer.

A thickness of the first metal layer 201 may be smaller than a thickness of the second metal layer 202.

For example, the thickness of the first metal layer 201 may be 0.7 μm to 2 μm, and the thickness of the second metal layer 202 may be 10 μm to 25 μm.

The first metal layer 201 and the second metal layer 202 may include the same metal material. For example, the first metal layer 201 and the second metal layer 202 may include copper (Cu).

Also, a bonding layer 203 may be disposed on the second metal layer 201. In detail, the bonding layer 203 may be disposed on a side surface of the first metal layer 201, a side surface of the second metal layer 202, and an upper surface of the second metal layer 202. That is, the bonding layer 203 may be disposed while surrounding the first metal layer 201 and the second metal layer 202.

The bonding layer 203 may include a metal. In detail, the bonding layer 203 may include tin (Sn).

The bonding layer 203 may be formed to a thickness of 0.3 μm to 0.7 μm. The bonding layer 203 may have a higher tin content while extending from a lower surface in contact with the second metal layer 202 to an upper surface.

That is, the bonding layer 203 is disposed in contact with the second metal layer 202. Accordingly, the tin content of the bonding layer 203 may increase from the lower surface to the upper surface direction and the copper content may decrease.

Accordingly, only pure tin may remain in the thickness range of 0.1 μm to 0.3 μm on the upper surface of the bonding layer 203.

By the bonding layer 203, the terminals of the chip, the printed circuit board, and the display panel may be easily bonded to the first pad part and the second pad part through heat and pressure. That is, when heat and pressure are applied to the first pad part and the second pad part, the upper surface on which pure tin remains in the bonding layer is melted. Accordingly, the first pad part and the second pad part may be easily adhered to the terminals of the chip, the printed circuit board, and the display panel.

Accordingly, the bonding layer 203 is not separated from the first pad part 212a and may become a part of the first pad part.

The first circuit pattern 210 may be disposed to have a thickness of 2 μm to 25 μm. For example, the first circuit pattern 210 may be disposed to have a thickness of 5 μm to 20 μm. For example, the first circuit pattern 210 may be disposed to have a thickness of 7 μm to 15 μm.

Since the first circuit pattern 210 is subjected to a process of etching the first metal layer by flash etching performed for separation of the circuit patterns during a manufacturing process, the first circuit pattern 210 to be finally manufactured may be smaller than the sum of the thicknesses of the first metal layer 201, the second metal layer 202, and the bonding layer 203.

When the thickness of the first circuit pattern 210 and the second circuit pattern 220 is less than 2 μm, resistances of the first circuit pattern 210 and the second circuit pattern 220 may increase. When the thickness of the first circuit pattern 210 and the second circuit pattern 220 exceeds 25 μm, it may be difficult to implement a fine pattern.

Meanwhile, a buffer layer may be further disposed between the substrate 100 and the first circuit pattern 210 and the second circuit pattern 220. The buffer layer may improve adhesion between the substrate 100 and the first circuit pattern 210 and the second circuit pattern 220 that are a dissimilar material.

The buffer layer 205 may be formed in multiple layers. In detail, a first buffer layer 205a and a second buffer layer 205b on the first buffer layer 205a may be disposed on the substrate 100. Accordingly, the first buffer layer 205a may be in contact with the substrate 100, and the second buffer layer 205b may be disposed in contact with the first circuit pattern 210.

The first buffer layer 205a may include a material having good adhesion to the substrate 100. For example, the first buffer layer 205a may include nickel (Ni). In addition, the second buffer layer 205b may include a material having good adhesion to the first circuit pattern 210. For example, the second buffer 205b layer may include chromium (Cr).

The buffer layer including the first buffer layer 205a and the second buffer layer 205b may have a thin film thickness of nanometers. For example, the buffer layer 205 may have a thickness of 20 nm or less.

Since the adhesion between the substrate 100 and the first circuit pattern 210 that are a dissimilar material may be improved by the buffer layer 205, it is possible to inhibit delamination of a film of the first circuit pattern 210.

Meanwhile, referring to FIG. 4, the bonding layer 203 may include a first bonding layer 203a and a second bonding layer 203b.

In detail, the first bonding layer 203a may be disposed on the first wiring part 211 and the first pad part 212a. In addition, although not shown in the drawings, the first bonding layer 203a may also be disposed on the second pad part 212b. That is, the first bonding layer 203a may be disposed on the first circuit pattern 210.

In addition, the second bonding layer 203b may be disposed only on the first pad part 212a and the second pad part 212b. That is, the first wiring part 211 may have a layer structure different from that of the first pad part 212a and the second pad part 212b due to the second bonding layer 203b.

The first bonding layer 203a and the second bonding layer 203b may include a metal. In detail, the first bonding layer 203a and the second bonding layer 203b may include tin (Sn).

The first bonding layer 203a and the second bonding layer 203b may be disposed to have different thicknesses. In detail, the thickness of the second bonding layer 203b may be larger than the thickness of the first bonding layer 203a.

For example, the first bonding layer 203a may have a thin film thickness of 0.02 μm to 0.06 μm, and the second bonding layer 203b may have a thickness of 0.2 μm to 0.6 μm.

When the bonding layer between the protective layer 300 and the first wiring part 211 is thickly disposed, cracks may occur when the flexible printed circuit board is bent. Accordingly, the first bonding layer 231 between the protective layer 300 and the first wiring part 211 may be formed to have a thin film thickness. Accordingly, it is possible to inhibit cracks from occurring when the flexible printed circuit board is bent.

Also, the second bonding layer 203b may have a higher tin content while extending from the lower surface in contact with the first bonding layer 203a toward the upper surface.

That is, in the second bonding layer 203b, the content of tin may increase and the content of copper may decrease from the lower surface toward the upper surface.

Accordingly, only pure tin may remain in the thickness range of 0.1 μm to 0.3 μm on the upper surface of the second bonding layer 203b.

By the second bonding layer 203b, the terminals of the chip, the printed circuit board, and the display panel may be easily bonded to the first pad part and the second pad part through heat and pressure. That is, when heat and pressure are applied to the first pad part and the second pad part, the upper surface on which pure tin remains in the bonding layer may be melted. Accordingly, the first pad part and the second pad part may be easily adhered to the terminals of the chip, the printed circuit board, and the display panel.

Accordingly, the first bonding layer 203a and the second bonding layer 203b are not separated from the first pad part 212a, but may become a part of the first pad part.

Meanwhile, the protective layer 300 may be disposed on the wiring part of the first circuit pattern 210 and the second circuit pattern 220. In detail, the protective layer 300 may be disposed to surround the first wiring part 211 and the second wiring part 221. That is, the protective layer 300 may be disposed on the first circuit pattern 210 and the second circuit pattern 220 excluding the first pad part, the second pad part, the third pad part, and the fourth pad part.

The protective layer 300 may include solder paste. For example, the protective layer 400 may include a solder paste including a thermosetting resin, a thermoplastic resin, a filler, a curing agent, or a curing accelerator.

As described above, the flexible printed circuit board may be bent in one direction. Accordingly, a bending area may be formed in the flexible printed circuit board. In the bending area, compressive stress and tensile stress according to bending may occur. Accordingly, the circuit patterns disposed in the bending area of the flexible printed circuit board may be cracked or may be removed from the substrate by the compressive stress and tensile stress.

Hereinafter, the flexible printed circuit board having a new structure capable of solving the above problems will be described.

First, referring to FIGS. 1 and 2, as described above, the flexible printed circuit board 1000 includes a bending axis BAX. And, In the flexible printed circuit board 1000, a first area 1A and a second area 2A may be defined by the bending axis BAX.

The bending axis BAX may be disposed adjacent to the second pad part 212b. In detail, the bending axis BAX may be disposed closer to the second pad part 212b than the fourth pad part 222b. Accordingly, the first area 1A formed by the bending axis BAX may be disposed adjacent to the second pad part 212b of the first circuit pattern 210. That is, the bending axis BAX may be disposed closer to the second pad part 212b of the first circuit pattern than the fourth pad part 222b of the second circuit pattern.

Also, the first area 1A may be disposed to be spaced apart from the end of the protective layer 300. For example, the protective layer 300 may include a first end E1, a second end E2, a third end E3, and a fourth end E4. The first end E1 may be disposed adjacent to the second pad part 212b, and the second end E2 may be disposed adjacent to the fourth pad part 222b. The first end E1 and the second end E2 may extend in one direction while facing each other.

In addition, the third end E3 and the fourth end E4 may be disposed to connect the first end E1 and the second end E2. The third end E3 and the fourth end E4 may extend in a direction different from the one direction while facing each other.

The first area 1A may be spaced apart from the end of the protective layer 300 within a set range. In detail, the first area 1A may be disposed to be spaced apart from the first end E1 by 5 mm or less. In more detail, the first area 1A may be disposed to be spaced apart from the first end E1 by 1 mm or less.

The first area 1A may be defined by a first boundary area BA1 and a second boundary area BA2 of the substrate 100. The first boundary area BA1 is defined as a boundary area between the first area 1A and the 2-1 area 2-1A in which the second pad part 212b is disposed. In addition, the second boundary area BA2 is defined as a boundary area between the first area 1A and the 2-2 area 2-2A in which the fourth pad part 222b is disposed.

For example, the first boundary area BA1 may be defined as an area where bending starts in the flexible printed circuit board, and the second boundary area BA2 may be defined as an area where bending ends in the flexible printed circuit board.

Accordingly, the first area 1A may be disposed between the first boundary area BA1 and the second boundary area BA2.

The circuit pattern may be disposed in both the first area 1A and the second area 2A. In detail, the first wiring part 211 may be disposed in both the first area 1A and the second area 1A. Also, the width of the first wiring part 211 disposed in the first area 1A and the second area 2A may be different. In addition, an interval between the first wiring part 211 disposed in the first area 1A and the second area 2A may be different.

FIGS. 6 to 11 are enlarged views of area C in FIG. 1.

Figure 6:
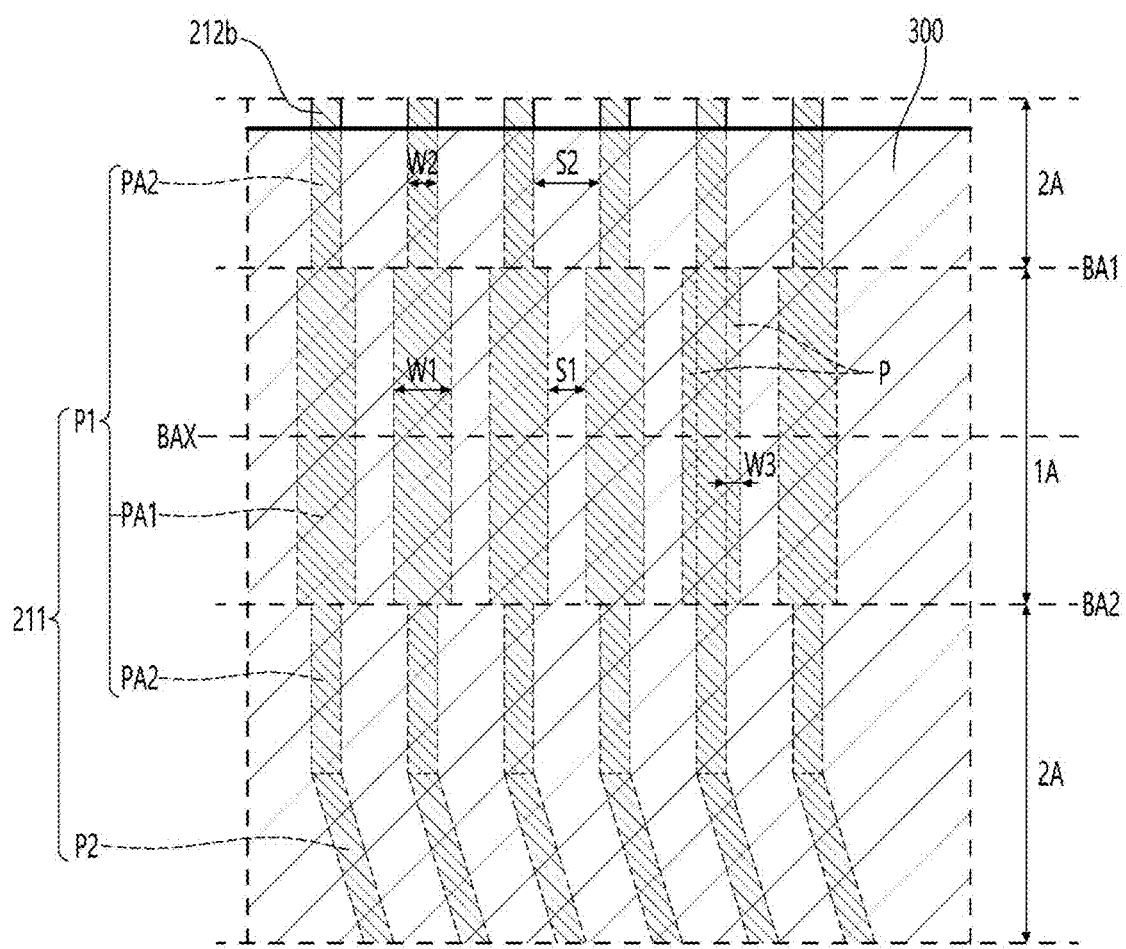
FIGS. 6 to 11 are enlarged views of area C in FIG. 1.

Referring to FIG. 6, the first circuit pattern 210 may be formed to have different widths and intervals for each region. In detail, the first wiring part 211 of the first circuit pattern 210 may be formed to have different widths and intervals for each area.

In detail, the first wiring part 211 may include a first pattern P1 and a second pattern P2. The first pattern P1 and the second pattern P2 may be connected to each other. That is, the first pattern P1 and the second pattern P2 may be integrally formed. Also, the first pattern P1 and the second pattern P2 may extend in different directions. In detail, the second pattern P2 may be bent and extended from the first pattern P1.

The first pattern P1 may be connected to the second pad part 212b connected to the display panel. In detail, the first pattern P1 may contact the second pad part 212b and extend in the direction of the second pad part 212b. In more detail, the first pattern P1 may contact the second pad part 212b and extend in a straight line in the direction of the second pad part 212b.

Also, the second pattern P2 may be connected to the first pad part 212a connected to the chip. That is, the first pad part 212a and the second pad part 212b may be connected by the first pattern P1 and the second pattern P2.

In the drawings, it is illustrated that the second pattern P2 bent from the first pattern P1 extends in one direction for convenience of description, but the embodiment is not limited thereto. The second pattern P2 may be connected to the first pattern P1 and may be connected to the first pad part 212a while extending in multiple directions. That is, the second pattern P2 connected to the first pattern P1 may be disposed to extend in at least one direction.

The protective layer 300 may be disposed on the first pattern P1. In addition, the protective layer 300 may be disposed on the second pattern P2. That is, the first pattern P1 and the second pattern P2 may be disposed under the protective layer 300. Accordingly, it is possible to inhibit the wiring part from being deformed due to external impurities.

The first pattern P1 may include an extension area P. In detail, the first pattern P1 may include a first pattern part PA1 and a second pattern part PA2. The width and interval of the first pattern part PA1 and the second pattern part PA2 may be different from each other. For example, a width of the first pattern part PA1 may be greater than a width of the second pattern part PA2, and the interval between the first pattern parts PA1 may be smaller than an interval between the second pattern parts PA2. That is, the first pattern part PA1 may be an extension area P of the first pattern P1. In more detail, the first pattern part PA1 may include an extension area P having a width greater than that of the second pattern part PA2.

In detail, the first pattern P1 may be disposed in the first area 1A and the second area 2A. Also, the second pattern P2 may be disposed in the second area 2A.

That is, the first pattern P1 may include a first pattern part PA1 and a second pattern part PA2 disposed in the first area 1A and the second area 2A. In detail, the first pattern P1 may include a first pattern part PA1 disposed in the first area 1A and the second pattern part PA2 disposed in the second area 2A. In more detail, the first pattern P1 may include a first pattern part PA1 disposed in an area in which the flexible printed circuit board 1000 is bent and a second pattern part PA2 disposed in an area in which the flexible printed circuit board 1000 is not bent. In more detail, the first pattern P1 may be include a first pattern part PA1 disposed in a bending area of the flexible printed circuit board 1000 and a second pattern part PA2 disposed in a non-bending area of the flexible printed circuit board 1000

Accordingly, the first pattern part PA1 disposed in the first area 1A may have a width greater than that of the second pattern part PA2 disposed in the second area 2A, and may have a smaller interval.

In this case, the first pattern part PA1 may be disposed to be spaced apart from the end of the protective layer 300. In detail, the first pattern part PA1 may be disposed to be spaced apart from the end of the protective layer 300 within a set range. In detail, the first pattern part PA1 may be disposed to be spaced apart from the first end E1 by 5 mm or less. In more detail, the first pattern part PA1 may be disposed to be spaced apart from the first end E1 by 1 mm or less. That is, the first pattern part PA1 may be disposed within 5 mm or within 1 mm from the first end E1.

That is, the extension area of the first pattern may be disposed within 5 mm or 1 mm from the first end E1 of the protective layer 300.

The maximum width of the first pattern part PA1 may be greater than that of other pattern parts. In detail, the maximum width of the first pattern part PA1 may be greater than the maximum width of the second pad part 212b.

In addition, referring to FIG. 6, the width and interval of the first pattern part PA1 disposed in the first area 1A may be different the width and interval of the second pattern part PA2 disposed in the second area 2A. For example, the first pattern part PA1 may be formed to have a first width W1 in the first area 1A and may be spaced apart from each other by a first interval S1. In addition, the second pattern part PA2 may be formed to have a second width W2 in the first area 2A and may be spaced apart from each other by a second interval S2.

In this case, the sizes of the first width W1 and the second width W2 may be different. In detail, the size of the first width W1 may be greater than the size of the second width W2. Also, the size of the first interval S1 and the second interval S2 may be different. In detail, the size of the first interval S1 may be smaller than the size of the second interval S2.

That is, the width of the first pattern part PA1 disposed in the first area 1A is greater than the width of the second pattern part PA2 disposed in the second area 2A, and the interval between the first pattern parts PA1 disposed in the first area 1A may be smaller than the interval between the second pattern parts PA2 disposed in the second area 2A.

In detail, the extension area P of the first pattern part PA1 may include a protrusion extending in a width direction of the first wiring part. Accordingly, the width of the first pattern part PA1 disposed in the first area 1A may be greater than the width of the second pattern part PA2 disposed in the second area 2A by the width of the protrusion. Also, the interval between the first pattern parts PA1 disposed in the first area 1A may be smaller than the interval between the second pattern parts PA2 disposed in the second area 2A by a width of the protrusion.

In this case, the protrusion may be formed to have a width within a set range. In detail, the width W3 of the protrusion may be smaller than the second interval S2 In more detail, the width W3 of the protrusion may be 50% or less of the second interval S2. That is, the width W3 of the protrusion may be less than or equal to half of the second interval S2. The second interval S2 may be defined as a minimum interval among intervals of the second interval S2. When the width W3 of the protrusion exceeds 50% of the second interval S2, the first pattern parts PA1 adjacent to each other in the first area 1A may be shorted. Accordingly, the reliability of the flexible printed circuit board may be reduced.

In the flexible printed circuit board according to the embodiment, as shown in FIG. 6, the width of the first pattern part disposed in the first area may be greater than the width of the second pattern part disposed in the second area. Accordingly, the strength of the first wiring part disposed in the first area may be increased. Accordingly, when the flexible printed circuit board is bent, it is possible to inhibit cracks in the first wiring part disposed in the bending area.

Figure 7:
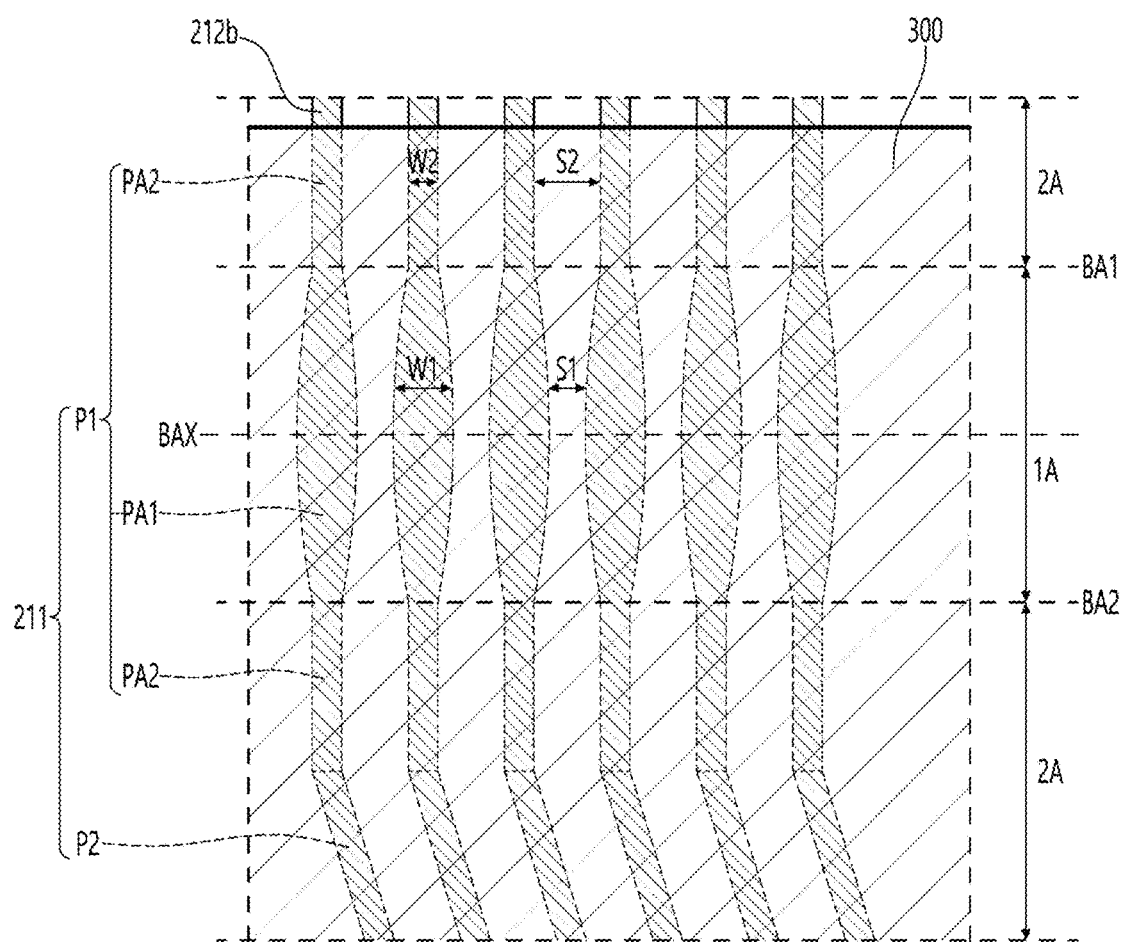
Figure 8:
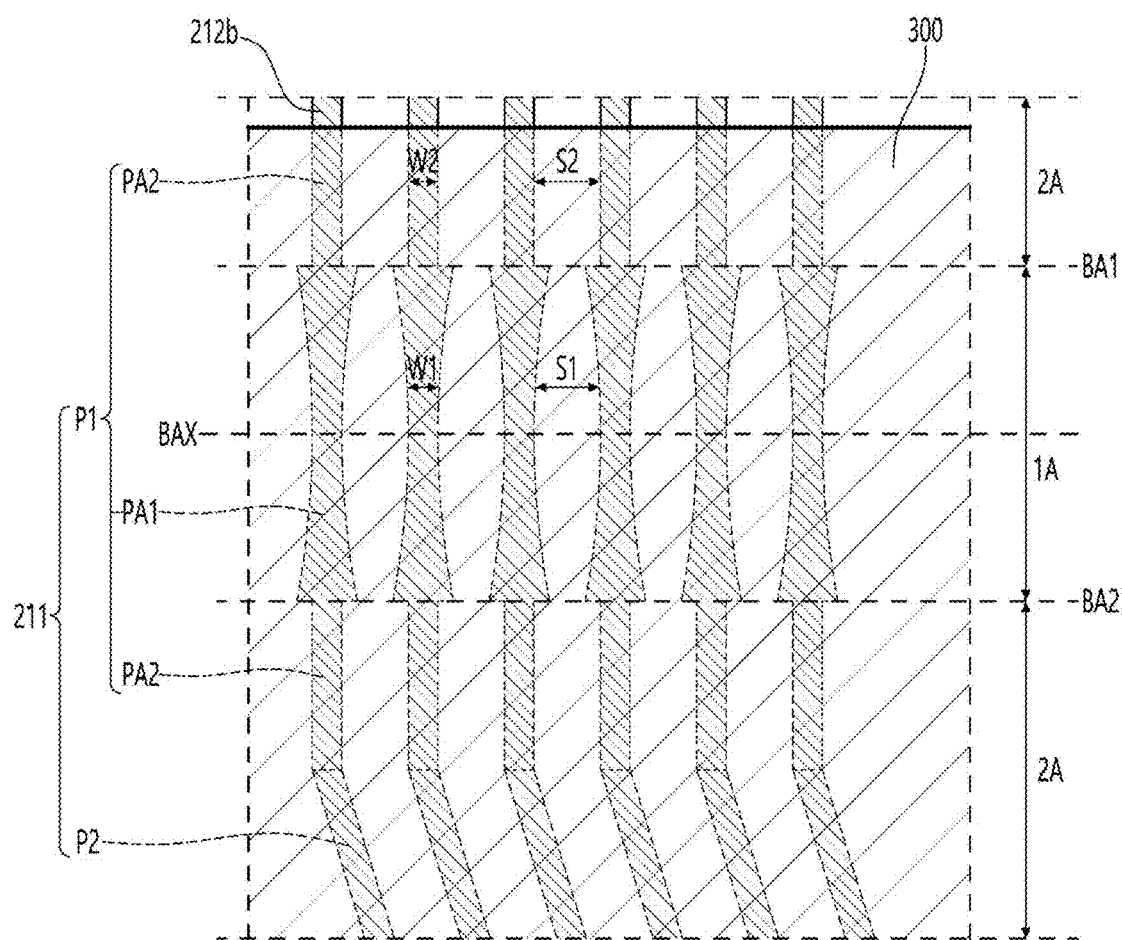

Referring to FIGS. 7 and 8, the first wiring part 211 of the first circuit pattern 210 may be formed to have different width and interval for each region.

In detail, the width and interval of the first pattern part PA1 disposed in the first area 1A may be different from the width and interval of the second pattern part PA2 disposed in the second area 2A. For example, the first pattern part PA1 may be formed to have a first width W1 in the first area 1A and may be spaced apart from each other by a first interval S1. In addition, the second pattern part PA2 may be formed to have a second width W2 in the first area 2A and may be spaced apart from each other by a second interval S2.

In this case, the sizes of the first width W1 and the second width W2 may be different. In detail, the size of the first width W1 may be greater than the size of the second width W2. Also, the size of the first interval S1 and the second interval S2 may be different. In detail, the size of the first interval S1 may be smaller than the size of the second interval S2.

Also, the distance between the first wiring parts 211 may be changed in the first area 1A. In detail, the first interval S1 of the first pattern part PA1 may be changed while extending from the first boundary area BA1 to the second boundary area BA2.

Referring to FIG. 7, while extending in the bending axis BAX direction from the first boundary area BA1, the size of the first interval S1 may decrease. That is, the first interval S1 of the first boundary area BA1 may be greater than the first interval S1 of the bending axis BAX.

In addition, while extending in the bending axis BAX direction from the second boundary area BA2, the size of the first interval S1 may decrease. That is, the first interval S1 of the second boundary area BA2 may be greater than the first interval S1 of the bending axis BAX.

Accordingly, the width of the first pattern part PA1 of the first area 1A may also be changed. That is, the first width W1 of the first pattern part PA1 of the first area 1A may be the largest in the bending axis BAX, and the smallest in the first boundary area BA1 and the second boundary area BA2. For example, the first width W1 of the first pattern part PA1 of the first area 1A may gradually decrease while extending from the bending axis BAX to the first boundary area BA1. Also, the first width W1 of the first pattern part PA1 of the first area 1A may gradually decrease while extending from the bending axis BAX to the second boundary area BA2.

Alternatively, referring to FIG. 8, while extending from the first boundary area BA1 in the bending axis BAX direction, the size of the first interval S1 may increase. That is, the first interval S1 of the first boundary area BA1 may be smaller than the first interval S1 of the bending axis BAX.

In addition, while extending in the bending axis BAX direction from the second boundary area BA2, the size of the first interval S1 may increase. That is, the first interval S1 of the second boundary area BA2 may be smaller than the first interval S1 of the bending axis BAX.

Accordingly, the width of the first pattern part PA1 of the first area 1A may also be changed. That is, the first width W1 of the first pattern part PA1 of the first area 1A may be smallest in the bending axis BAX, and may be largest in the first boundary area BA1 and the second boundary area BA2. For example, the first width W1 of the first pattern part PA1 of the first area 1A may gradually increase while extending from the bending axis BAX to the first boundary area BA1 and may gradually increase while extending from the bending axis BAX to the second boundary area BA2.

That is, the extension area of the first pattern part may include a change region in which the width of the extension area increases or decreases.

The first pattern part PA1 disposed in the first area 1A may include a curved surface. That is, the side surface of the first pattern part PA1 disposed in the first area 1A may include a curved surface. However, the embodiment is not limited thereto. As the width and interval of the first pattern part PA1 disposed in the first area 1A change, the side surface of the first pattern part PA1 may include only a plane surface. Alternatively, as the width and interval of the first pattern part PA1 disposed in the first area 1A are changed, the side surface of the first pattern portion PA1 may include both a flat surface and a curved surface.

In the flexible printed circuit board according to the embodiment, the width of the first pattern part disposed in the first area is greater than the width of the second pattern part disposed in the second area. Accordingly, when the flexible printed circuit board is bent, it is possible to inhibit cracks from occurring in the first wiring part in the bending area.

In addition, as shown in FIGS. 7 and 8, the width of the first pattern part disposed in the first area may be varied. That is, as shown in FIG. 7, the width of the first pattern part disposed in the first area may gradually decrease as it moves away from the bending axis. Alternatively, as shown in FIG. 8, the width of the second pattern part disposed in the second area may gradually increase as it moves away from the bending axis.

Accordingly, the width of the first pattern part may be set according to the amount of stress that varies according to the shape of the first area.

That is, when the shape of the first area of the flexible printed circuit board is a shape in which the curvature decreases as it moves away from the bending axis, the stress may decrease as it moves away from the bending axis.

Accordingly, as shown in FIG. 7, the width of the first pattern part disposed in the first area may be formed to gradually decrease as it moves away from the bending axis. Accordingly, it is possible to effectively inhibit cracks in the first wiring part and short circuits in the first wiring parts.

Alternatively, when the shape of the first area of the flexible printed circuit board is a shape in which the curvature increases as it moves away from the bending axis, the stress may increase as it moves away from the bending axis.

Accordingly, as shown in FIG. 8, the width of the first pattern part disposed in the first area may be formed to gradually increase as it moves away from the bending axis. Accordingly, it is possible to effectively inhibit cracks in the first wiring part and short circuits in the first wiring parts.

Figure 9:
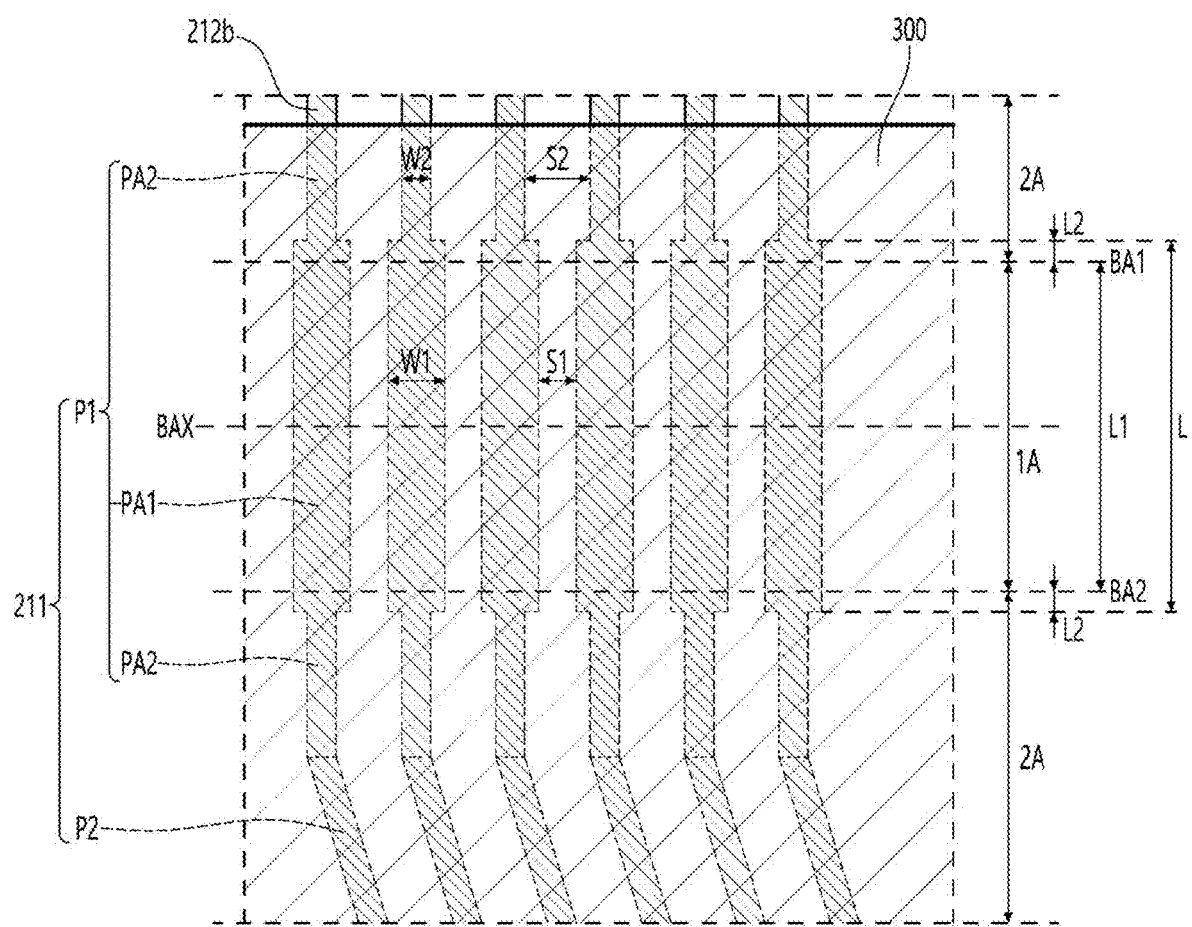

Referring to FIG. 9, the first pattern part PA1 of the first circuit pattern 210 may be disposed in both the first area 1A and the second area 2A. That is, the extension area may be disposed in both the first area 1A and the second area 2A.

The first pattern part PA1 may have a first length L1 and a second length L2. In detail, the first pattern part PA1 may include a first length L1 disposed in the first area 1A and a second length L2 disposed in the second area 2A.

The first length L1 and the second length L2 may be different from each other. In detail, the first length L1 may be greater than the second length L2. That is, the first length L1 of the first pattern part PA1 disposed in the first area 1A may be greater than the second length L2 of the first pattern part PA1 disposed in the second area 2A. That is, an area of the first pattern part PA1 disposed in the first area 1A may be larger than an area of the first pattern part PA1 disposed in the second area 2A.

For example, the first length L1 may be greater than or equal to 90% of the total length L of the first pattern part PA1. Also, the second length L2 may be less than or equal to 10% of the total length L of the first pattern part PA1. In detail, the second length L2 may be 1% to 10% of the total length L of the first wiring part 211.

The flexible printed circuit board according to the embodiment may include a first pattern part and a second pattern part in which the first pattern part PA1 has different widths. In detail, the flexible printed circuit board may include a first pattern part disposed in the first area and the second area and a second pattern part disposed in the second area.

Also, the width of the first pattern part may be greater than the width of the second pattern part. Accordingly, the strength of the wiring may be increased by making the width of the first pattern part disposed in the first area larger than that of other areas. Accordingly, when the flexible printed circuit board is bent, it is possible to inhibit cracks in the first wiring part disposed in the first area.

In addition, the first pattern part may be disposed in the second area. That is, the first pattern part may also be disposed in the second area which is adjacent to the first boundary area and the second boundary area. Accordingly, it is possible to inhibit changes in the size of the first pattern portion in the first area and the second area.

In addition, the first pattern part is also disposed in the second area adjacent to the first area. Accordingly, even when the stress generated when bending the flexible printed circuit board is transferred to the second area, the reliability of the first pattern part can be secured.

Figure 10:
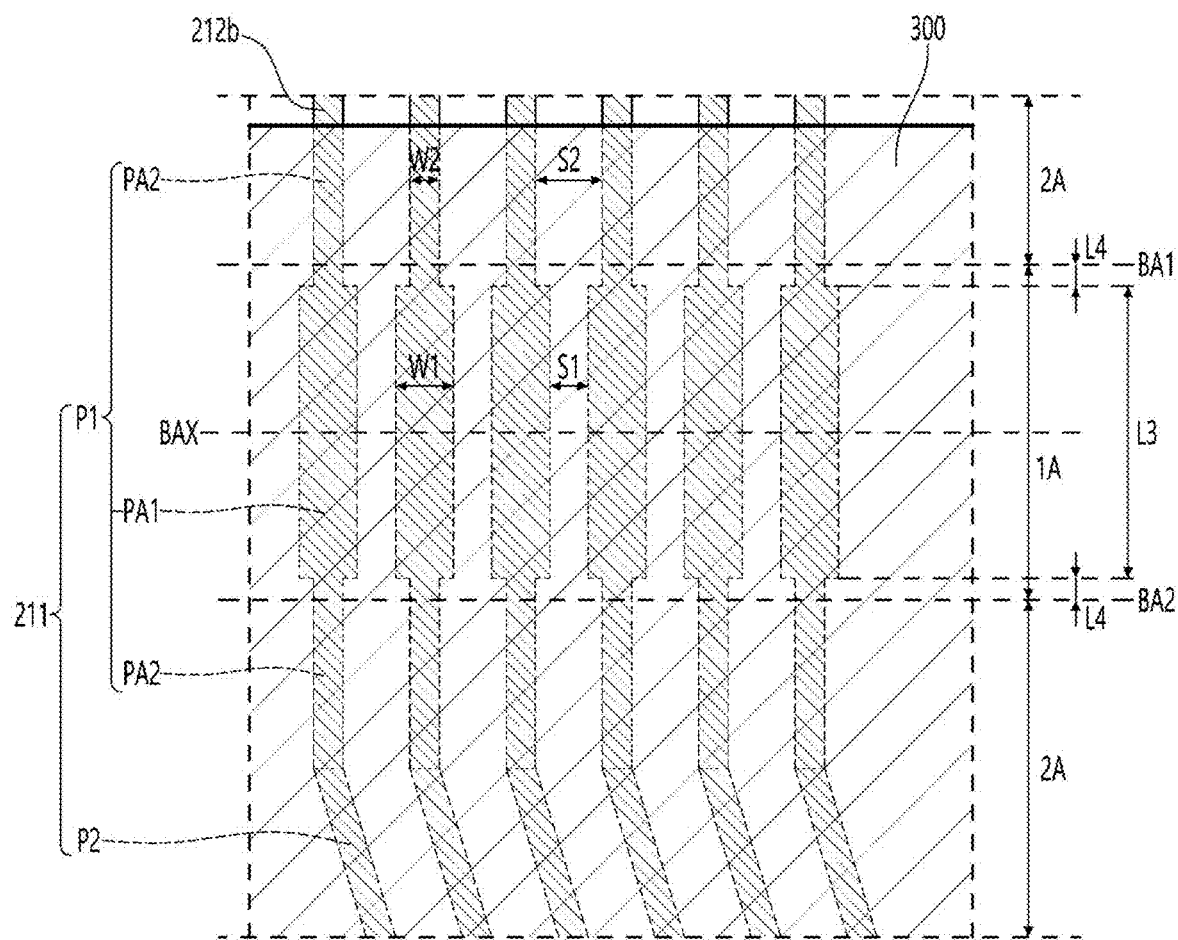

Referring to FIG. 10, the second pattern part PA2 of the first circuit pattern 210 may be disposed in both the first area 1A and the second area 2A.

The first pattern part PA1 and the second pattern part PA2 may be disposed in the first area 1A. For example, the first pattern part PA1 having a third length L3 and the second pattern part PA2 having a fourth length L4 may be disposed in the first area 1A.

The third length L3 and the fourth length L4 may be different from each other. In detail, the third length L3 may be greater than the fourth length L4. That is, in the first area 1A, the third length L3 of the first pattern part PA1 may be greater than the fourth length L4 of the second pattern part PA2.

For example, the third length L3 may be at least twice the fourth length L4. In detail, the third length L3 may be 2 to 10 times the fourth length L4.

That is, in the first area 1A, a length of the first pattern part PA1 having a large width may be longer than a length of the second pattern part PA2 having a small width. That is, in the first area 1A, an area of the first pattern part PA1 having a large width may be larger than an area of the second pattern part PA2 having a small width.

In the flexible printed circuit board according to the embodiment, as shown in FIG. 10, the second pattern part may also be disposed in the first area. That is, the second pattern part may also be disposed in the first area which is adjacent to the first boundary area and the second boundary area. Accordingly, it is possible to inhibit the size of the first wiring part from changing in the first area and the second area.

In addition, the second pattern part is also disposed in the first area adjacent to the second area. Accordingly, in the boundary area where the stress generated when the flexible printed circuit board is bent is small, the interval between the wiring parts can be secured to a predetermined size or more. Accordingly, it is possible to inhibit a short circuit of the first wiring part and secure the reliability of the flexible printed circuit board.

Figure 11:
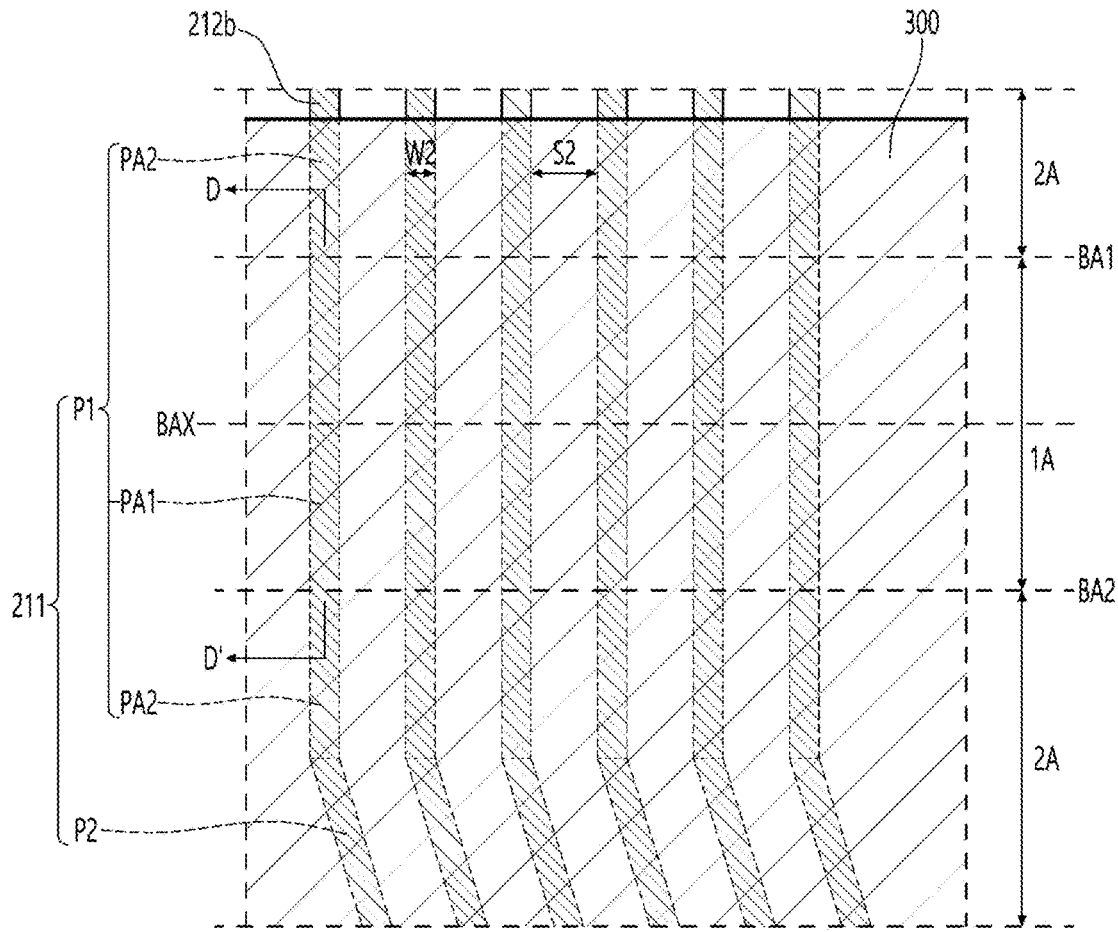
Figure 12:
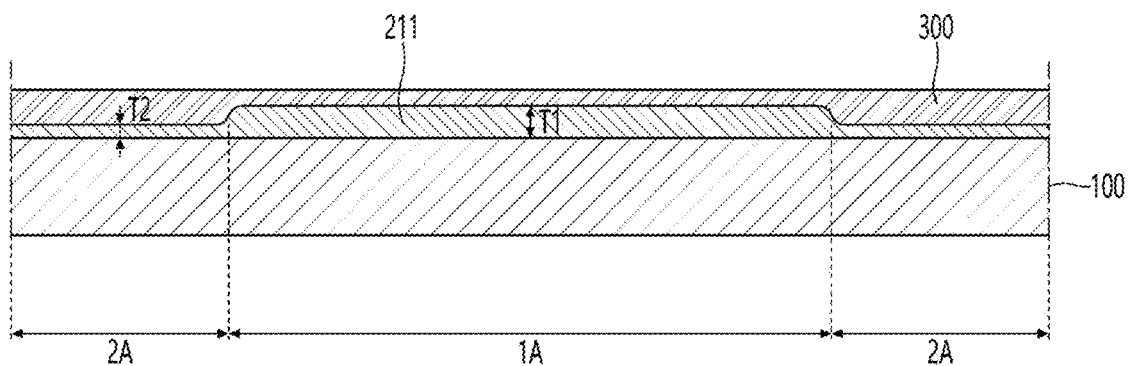
FIG. 12 is cross-sectional views taken along line D-D' in FIG. 11.

Referring to FIGS. 11 and 12, the first circuit pattern 210 may be formed to have a different thickness for each region. In detail, the first wiring part 211 of the first circuit pattern 210 may be formed to have a thickness with respect to each region.

In detail, the width and interval of the first wiring part 211 disposed in the first area 1A may be the same as or similar to those of the first wiring parts 211 disposed in the second area 2A.

Also, the thickness of the first wiring part 211 disposed in the first area 1A may be different from a thickness of the first wiring part 211 disposed in the second area 2A. In detail, the first wiring part 211 may be formed in the first area 1A with a first thickness T1 and may be formed with a second thickness T2 in the second area 2A.

In this case, the first thickness T1 and the second thickness T2 may be different. In detail, the first thickness T1 may be greater than the second thickness T2.

That is, the thickness of the extension area of the first pattern part PA1 may be greater than the thickness of the second pattern part PA2.

That is, the thickness of the first wiring part 211 disposed in the first area 1A may be greater than the thickness of the first wiring part disposed in the second area 2A.

In the flexible printed circuit board according to the embodiment, as shown in FIGS. 11 and 12, the thickness of the first wiring part disposed in the first area may be greater than the thickness of the first wiring part disposed in the second area. Accordingly, the strength of the first wiring part disposed in the first area may be increased. Accordingly, when the flexible printed circuit board is bent and bent, it is possible to inhibit cracks in the first wiring part disposed in the bending area.

Figure 13:
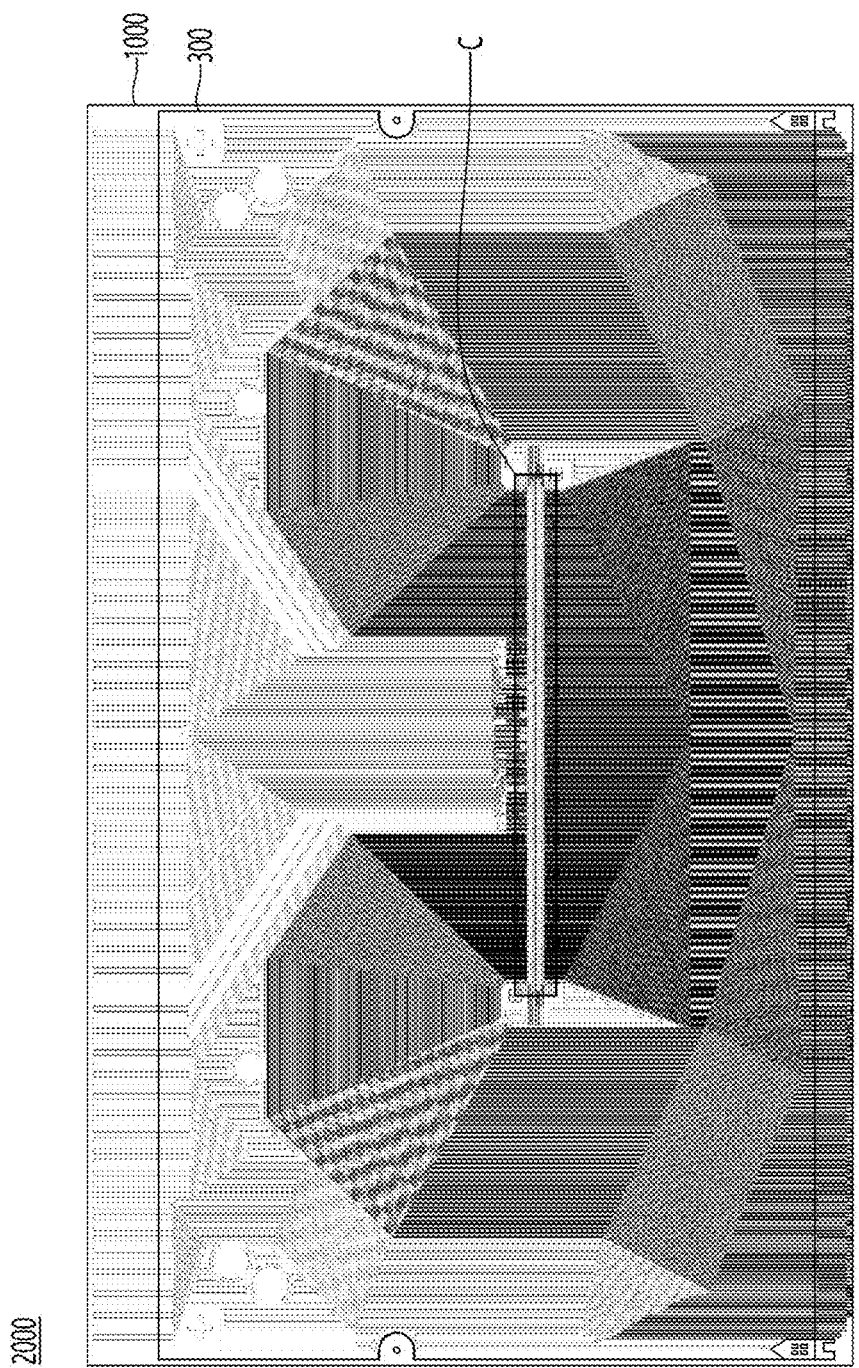
FIG. 13 is a top view of a COF module according to an embodiment.

FIG. 13 is a view showing a top view of a COF module according to an embodiment.

Referring to FIG. 13, the COF module according to the embodiment may include the flexible printed circuit board described above and the chip C disposed in the chip mounting region CA of the flexible printed circuit board 1000.

In addition, the flexible printed circuit board 1000 may include the protective layer 300 described above.

Meanwhile, the COF module may be manufactured by cutting the second region 2A of the flexible printed circuit board 1000 and then mounting the chip C. In detail, after cutting the boundary line CL between the first region 1A and the second region 2A of FIG. 1, a COF module 2000 may be manufactured, in which a driving chip electrically connected to the first circuit pattern and the second circuit pattern and disposed in the chip mounting region of the flexible printed circuit board is mounted.

For example, after testing the driving characteristics of the flexible printed circuit board through the wiring and the pad part disposed outside the cutting line CL of the flexible printed circuit board, the flexible printed circuit board is cut along the cutting line CL can be cut The COF module may be positioned between the display panel and the substrate to connect an electrical signal.

That is, pad parts of the first circuit pattern and the second circuit pattern that are exposed without the protective layer 300 being disposed may be connected to the display panel and the printed circuit board, and the chip in the chip mounting region.

Figure 14:
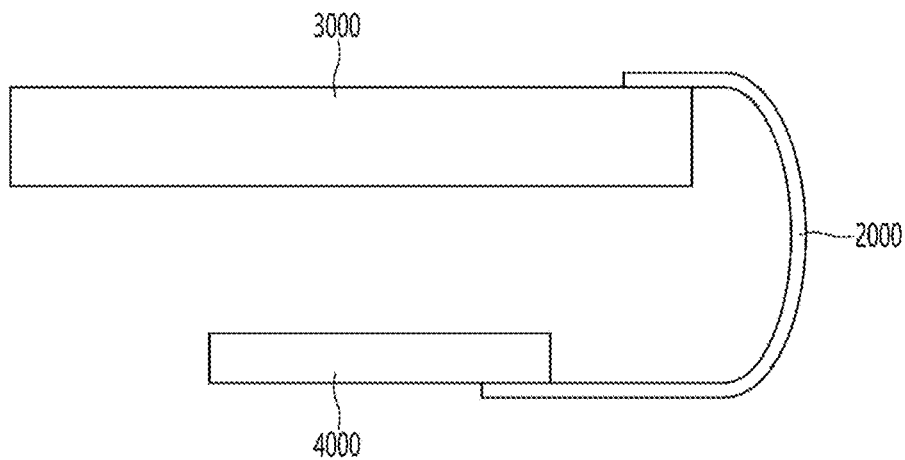
FIG. 14 is a cross-sectional view showing a connection relationship of the COF module including the flexible printed circuit board according to the embodiment.

Referring to FIG. 14, one end of the COF module 2000 including the flexible printed circuit board according to the embodiment may be connected to a display panel 3000, and the other end opposite to the one end may be connected to a printed circuit board 4000.

For example, one end of the COF module 2000 including the flexible printed circuit board according to the embodiment may be electrically connected by being in contact with the display panel 3000, and the other end opposite to the one end may be electrically connected by being in contact with the printed circuit board 4000. Here, the contact may refer to a direct contact. Alternatively, it may refer to contacting with an anisotropic conductive film (ACF) interposed therebetween.

As an example, the ACF may be disposed between the COF module 2000 and the printed circuit board 4000. The COF module 2000 and the printed circuit board 4000 may be electrically connected while being bonded by the ACF. The ACF may be a resin in which conductive particles are dispersed. Therefore, the electrical signal connected by the printed circuit board 4000 may be transmitted to the COF module 2000 through the conductive particles included in the ACF.

Since the COF module 2000 includes a flexible substrate, it may have a rigid shape or a bent shape between the display panel 3000 and the printed circuit board 4000.

The COF module 2000 may connect between the display panel 3000 and the printed circuit board 4000 disposed opposite to each other in a bent shape, thereby reducing a thickness of the electronic device and improving the degree of freedom in design. In addition, since the COF module 2000 including the flexible substrate may not be disconnected even in the bent shape, the reliability of the electronic device including the COF module may be improved.

Since the COF module is flexible, it may be used in various electronic devices.

Figure 15:
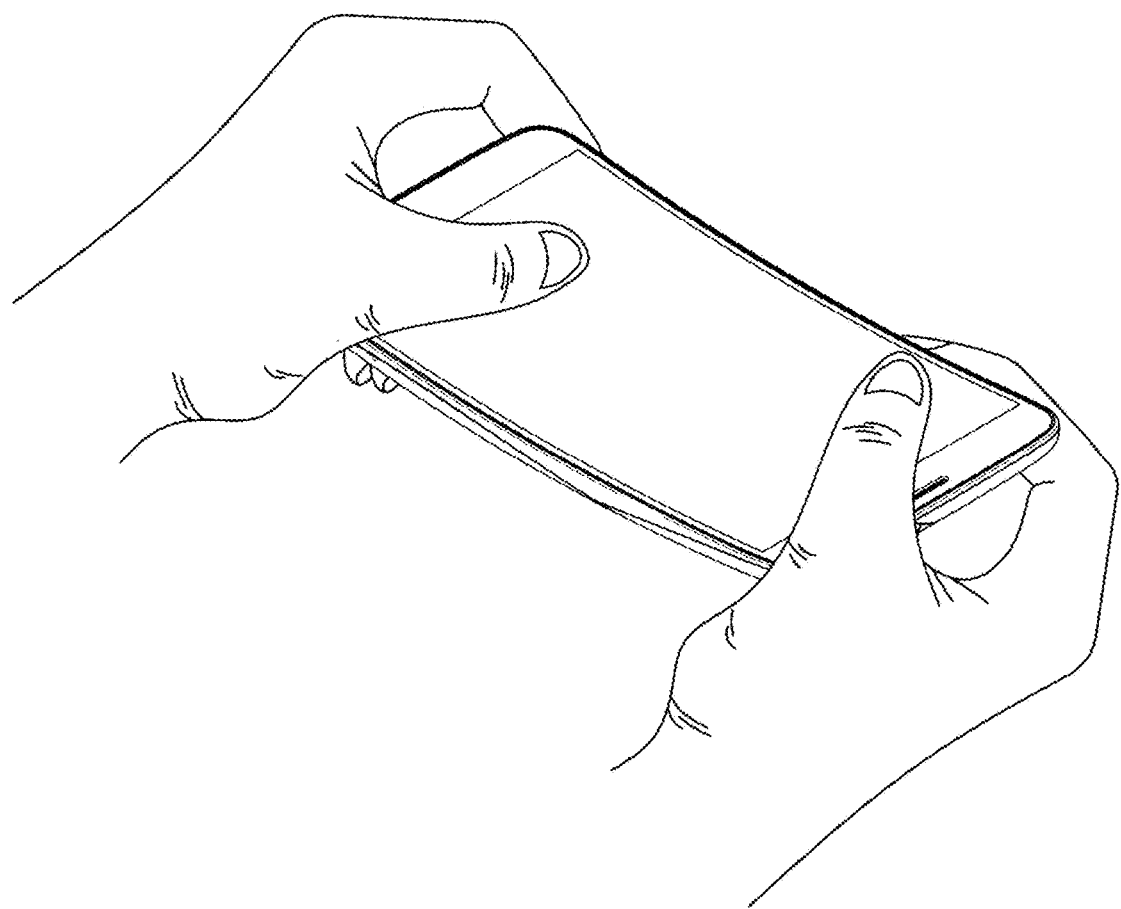
FIGS. 15 to 17 are views of an electronic device including the flexible printed circuit board according to the embodiment.

For example, referring to FIG. 15, the COF module may be included in a bendable flexible touch window. Therefore, a touch device including the same may be a flexible touch device. Therefore, a user may bend or fold it by hand. Such a flexible touch window may be applied to a wearable touch or the like.

Figure 16:
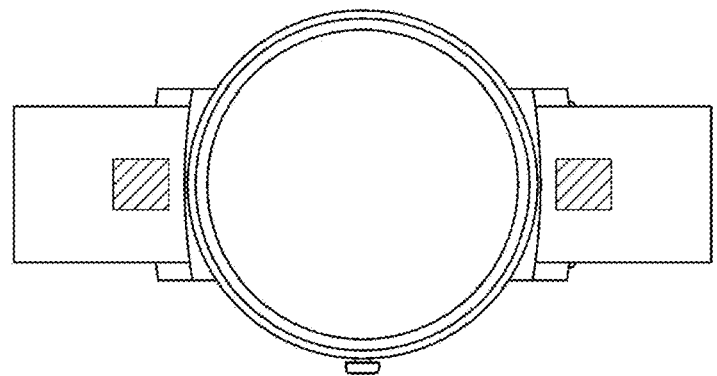

Referring to FIG. 16, the COF module may be included in various wearable touch devices including a curved display. Therefore, an electronic device including the COF module may be reduced in thickness or weight.

Figure 17:
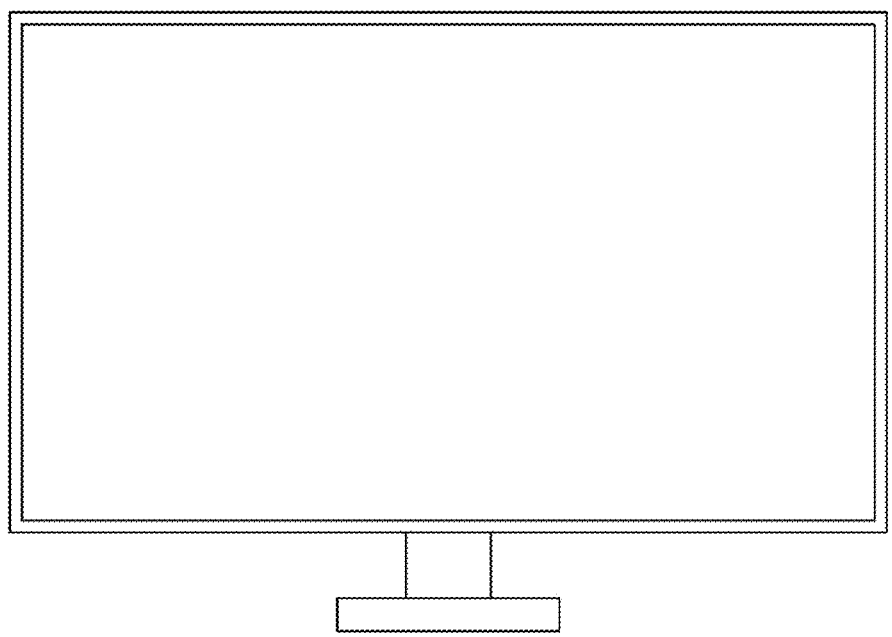

Referring to FIG. 17, the COF module may be used for various electronic devices having a display portion such as a TV, a monitor, and a laptop computer. In this case, the COF module may be used for an electronic device having a curved-shaped display portion However, the embodiment is not limited thereto, and of course, such a COF flexible printed circuit board and a COF module obtained by processing the same may be used for various electronic devices The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A flexible printed circuit board comprising:
   a substrate;
   a circuit pattern disposed on the substrate; and
   a protective layer disposed on the circuit pattern,
   wherein the circuit pattern includes a first circuit pattern and a second circuit pattern,
   wherein the first circuit pattern includes a first pad part, a second pad part, and a first wiring part connected to the first pad part and the second pad part,
   wherein the first wiring part includes a first pattern extending in contact with the second pad part,
   wherein the first pattern includes a first pattern part and a second pattern part disposed under the protective layer,
   wherein the first pattern part includes an extension area having a width greater than that of the second pattern part,
   wherein a maximum width of the first pattern part is greater than a maximum width of the second pad part.

2. The flexible printed circuit board of claim 1, wherein the first wiring part includes a second pattern bent from the first pattern and extending in at least one direction.

3. The flexible printed circuit board of claim 2, wherein the first pattern is connected to the second pad part connected to a display panel,
   wherein the second pattern is connected to the first pad part connected to a chip.

4. A flexible printed circuit board comprising: a substrate; a circuit pattern disposed on the substrate; and a protective layer disposed on the circuit pattern, wherein the circuit pattern includes a first circuit pattern and a second circuit pattern, wherein the first circuit pattern includes a first pad part, a second pad part, and a first wiring part connected to the first pad part and the second pad part, wherein the first wiring part includes a first pattern extending in contact with the second pad part, wherein the first pattern includes a first pattern part and a second pattern part disposed under the protective layer, wherein the first pattern part includes an extension area having a width greater than that of the second pattern part, wherein a maximum width of the first pattern part is greater than a maximum width of the second pad part, wherein the extension area includes a protrusion extending in the width direction of the first wiring part, wherein a width of the protrusion is 50% or less of the minimum interval of the first pattern part.

5. The flexible printed circuit board of claim 1, comprising a plurality of extension areas and a plurality of second pattern parts, wherein an interval between the extension areas is smaller than an interval between the second pattern parts.

6. The flexible printed circuit board of claim 1, wherein the extension area includes a change region in which a width of the extension region increases or decreases.

7. The flexible printed circuit board of claim 1, wherein the substrate includes a bending area and a non-bending area,
   wherein the extension area is disposed on the bending area.

8. The flexible printed circuit board of claim 7, wherein the extension area is also disposed in the non-bending area,
   wherein the extension region includes a first length on the bending region and a second length on the non-bending region,
   wherein the first length is longer than the second length.

9. The flexible printed circuit board of claim 8, wherein the first length is greater than or equal to 90% of the total length of the first pattern part.

10. The flexible printed circuit board of claim 7, wherein the first pattern part is disposed in the bending area,
    wherein the second pattern part is disposed in the bending area and the non-bending area,
    wherein the first pattern part having a third length and the second pattern part having a fourth length are disposed in the bending region,
    wherein the third length is longer than the fourth length.

11. The flexible printed circuit board of claim 10, wherein the third length is 2 to 10 times the fourth length.

12. A COF module comprising:
    a flexible printed circuit board of claim 1; and
    a chip disposed in a chip mounting area of the flexible printed circuit board.

13. An electronic device comprising:
    a COF module of claim 12;
    a display panel connected to the first circuit pattern; and
    a printed circuit board connected to the second circuit pattern.

14. A flexible printed circuit board comprising: a substrate; a circuit pattern disposed on the substrate; and a protective layer disposed on the circuit pattern, wherein the circuit pattern includes a first circuit pattern and a second circuit pattern, wherein the first circuit pattern includes a first pad part, a second pad part, and a first wiring part connected to the first pad part and the second pad part, wherein the first wiring part includes a first pattern extending in contact with the second pad part, wherein the first pattern includes a first pattern part and a second pattern part disposed under the protective layer, wherein the first pattern part includes an extension area thicker than the second pattern part, wherein the second pad part is exposed to the outside at a first end of the protective layer, wherein the extension area is disposed within 5 mm from the first end.

15. The flexible printed circuit board of claim 14, wherein the extension area includes a change region in which a width of the extension area increases or decreases.

16. The flexible printed circuit board of claim 14, wherein the first wiring part includes a second pattern bent from the first pattern and extending in at least one direction.

17. The flexible printed circuit board of claim 16, wherein the first pattern is connected to the second pad part connected to a display panel,
    wherein the second pattern is connected to the first pad part connected to a chip.

18. The flexible printed circuit board of claim 14, wherein the substrate includes a bending area and a non-bending area, wherein the extension area is disposed on the bending area.

\* \* \* \* \*